(12) United States Patent
Yang

(10) Patent No.: US 8,476,331 B2
(45) Date of Patent: Jul. 2, 2013

(54) PHOTOSENSITIVE RESIN COMPOSITION AND PREPARATION METHOD

(75) Inventor: Jiuxia Yang, Beijing (CN)

(73) Assignee: Boe Technology Group Co., Ltd., Beijing (CN)

( * ) Notice: Subject to any disclaimer, the term of this patent is extended or adjusted under 35 U.S.C. 154(b) by 234 days.

(21) Appl. No.: 12/954,033

(22) Filed: Nov. 24, 2010

(65) Prior Publication Data

US 2011/0123723 A1     May 26, 2011

(30) Foreign Application Priority Data

Nov. 26, 2009    (CN) .......................... 2009 1 0241576

(51) Int. Cl.
| | |
|---|---|
| *C08L 63/00* | (2006.01) |
| *C08K 3/00* | (2006.01) |
| *C08G 59/00* | (2006.01) |
| *B32B 27/18* | (2006.01) |
| *B32B 27/20* | (2006.01) |
| *B32B 27/38* | (2006.01) |

(52) U.S. Cl.
USPC .......................................................... 522/71

(58) Field of Classification Search
USPC ................ 427/487, 493, 508, 510, 511, 512, 427/514, 517, 519; 522/6, 31, 33, 38, 39, 522/44, 64, 65, 66, 68, 71, 74, 81, 83, 100, 522/101, 102, 103; 523/457, 458, 459, 466
See application file for complete search history.

(56) References Cited

U.S. PATENT DOCUMENTS

| | | | | |
|---|---|---|---|---|
| 5,747,552 | A | * | 5/1998 | Smith ............................ 522/96 |
| 5,753,722 | A | * | 5/1998 | Itokawa et al. ................. 522/83 |
| 6,136,506 | A | * | 10/2000 | Hashimoto et al. ........ 430/280.1 |
| 2003/0082355 | A1 | * | 5/2003 | Iwaida et al. ................. 428/209 |

* cited by examiner

*Primary Examiner* — Michael J Feely
(74) *Attorney, Agent, or Firm* — Ladas & Parry LLP

(57) ABSTRACT

A photosensitive resin composition comprises: 0.01 wt %-10 wt % of reflective particles; 0 wt %-12 wt % of pigment; 1 wt %-10 wt % of dispersant; 1.5 wt %-5 wt % of dispersion resin; 2 wt %-25 wt % of optically active polymer; 1 wt %-22 wt % of optical active monomer; 0.4 wt %-5 wt % of epoxy resin; 5 wt %-85 wt % of solvent; 0.1 wt %-3 wt % of photoinitiator; and 0.01 wt %-3.5 wt % of additives.

3 Claims, 1 Drawing Sheet

PHOTOSENSITIVE RESIN COMPOSITION AND PREPARATION METHOD

BACKGROUND

Embodiments of the invention are related to a photosensitive resin composition and a preparation method for manufacturing the same.

High color saturation and high transmissivity are important indexes to evaluate liquid crystal displays (LCDs). The performance of a color filter element used in a LCD mainly depends on the nature of the colored photosensitive resin composition and the filming process of the color filter element. To ensure heat resistance, chemical resistance and other properties of the color filter during the forming process, the colored photosensitive resin composition is required to have suitable properties such as heat resistance, light resistance, chemical resistance, transmittance, and colorimetric properties.

During the forming process of a color filter element which employs a photosensitive resin composition, the photosensitive resin composition is UV cured. However, when the conventional photosensitive resin compositions, especially the photosensitive resin compositions comprising a blue, green or black pigment, are used, high energy UV exposure is required and the UV efficiency is low because the composition strongly absorbs the ultraviolet light.

SUMMARY

One embodiment provides a photosensitive resin composition comprising: 0.01 wt %-10 wt % of reflective particles; 0 wt %-12 wt % of pigment; 1 wt %-10 wt % of dispersant; 1.5 wt %-5 wt % of dispersion resin; 2 wt %-25 wt % of optically active polymer; 1 wt %-22 wt % of optical active monomer; 0.4 wt %-5 wt % of epoxy resin; 5 wt %-85 wt % of solvent; 0.1 wt %-3 wt % of photoinitiator; and 0.01 wt %-3.5 wt % of additives.

Another embodiment provides a method for preparing a photosensitive resin composition comprising: mixing pigments, dispersants, dispersion resins, reflective particles, optically active polymers, optically active monomer, epoxy resin, photoinitiator, additives and solvent to form the photosensitive resin composition, wherein the photosensitive resin composition comprises: 0 wt %-12 wt % of pigment; 1 wt %-10 wt % of dispersant; 1.5 wt %-5 wt % of dispersion resin; 0.01 wt %-10 wt % of reflective particles; 2 wt %-25 wt % of optically active polymer; 1 wt %-22 wt % of optical active monomer; 0.4 wt %-5 wt % of epoxy resin; 0.1 wt %-3 wt % of photoinitiator; 0.01 wt %-3.5 wt % of additives; and 5 wt %-85 wt % of solvent.

Yet another embodiment provides a method for producing a layer of a photosensitive resin film comprising: coating a layer of photosensitive resin composition on the substrate; and exposing the photosensitive resin composition with UV irradiation; wherein the photosensitive resin composition comprises 0 wt %-12 wt % of pigment; 1 wt %-10 wt % of dispersant; 1.5 wt %-5 wt % of dispersion resin; 0.01 wt %-10 wt % of reflective particles; 2 wt %-25 wt % of optically active polymer; 1 wt %-22 wt % of optical active monomer; 0.4 wt %-5 wt % of epoxy resin; 0.1 wt %-3 wt % of photoinitiator; 0.01 wt %-3.5 wt % of additives and 5 wt %-85 wt % of solvent.

BRIEF DESCRIPTION OF THE DRAWINGS

The present invention will become more fully understood from the detailed description given hereinafter and the accompanying drawings which are given by way of illustration only, and thus are not limitative of the present invention and wherein.

DETAILED DESCRIPTION

Figure 1:
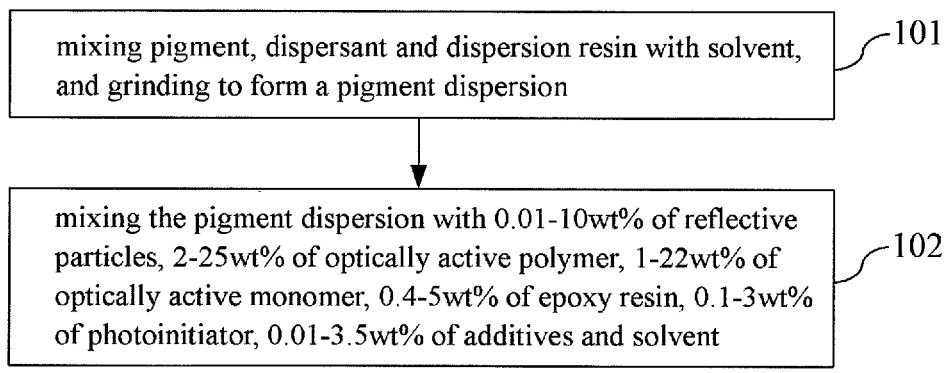
FIG. 1 is a process flow chart of preparation method example 1 of a photosensitive resin composition.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the following detailed description.

One embodiment of the present invention provides a photosensitive resin composition, which comprises: 0.01 wt %-10 wt % of reflective particles; 0 wt %-12 wt % of pigment; 1 wt %-10 wt % of dispersant; 1.5 wt %-5 wt % of dispersion resin; 2 wt %-25 wt % of optically active polymer; 1 wt %-22 wt % of optical active monomer; 0.4 wt %-5 wt % of epoxy resin; 5 wt %-85 wt % of solvent; 0.1 wt %-3 wt % of photoinitiator; and 0.01 wt %-3.5 wt % of additives. Here, all the weight percents are based on the total weight of the photosensitive resin composition.

The weight percentage of the reflective particles is preferably 0.03 wt %-10 wt %. The reflective particles are selected from the group consisting of titanium dioxide, barium sulfate, magnesium oxide, silicon oxide, zinc oxide, lithopone and zirconia. Furthermore, in order to mix reflective particles well with other components to form the photosensitive resin composition, the reflective particles preferably comprises nanometer reflective particles.

The pigment can be the blue pigment, blue and violet mixed pigment, green pigment, green and yellow mixed pigment, or black pigment. During the UV curing of the photosensitive resin compositions comprising one of the above pigments, high energy UV exposure is required because the pigment strongly absorbs the ultraviolet light. However, in this embodiment, because reflective particles incorporated into the photosensitive resin composition can highly reflect light, the photosensitive resin composition's absorption of ultraviolet light can be reduced during a light irradiation curing process, and the required energy of UV exposure is reduced accordingly.

Specifically, examples of the above blue pigment comprise P.B.1, P.B.2, P.B.7, P.B.15, P.B.15:1, P.B.15:2, P.B.15:3, P.B.15:4, P.B.15:5, P.B.15:6, P.B.22, P.B.60 or P.B.66, and so on. "P.B." refers to pigment blue and is a pigment code from the Color Index.

Examples of the above violet pigment comprise P.V.1, P.V.32, P.V.23, P.V.19, P.V.29, P.V.39, P.V.36 or P.V.38, and so on. "P.V." refers to pigment violet and is a pigment code from the Color Index.

Examples of the above green pigment comprise P.G. 2, P.G. 7, P.G. 8, P.G. 10, P.G. 37 or P.G. 36, and so on. "P.G." refers to pigment green and is a pigment code from the Color Index.

Examples of the above yellow pigment comprise P.Y.1, P.Y.12, P.Y.3, P.Y.13, P.Y.83, P.Y.93, P.Y.94, P.Y.95, P.Y.109, P.Y.126, P.Y.127, P.Y.138, P.Y.139, P.Y.147, P.Y.150, P.Y.174 or P.Y.180, and so on. "P.Y." refers to pigment yellow and is a pigment code from the Color Index.

Examples of the above black pigment comprise black #990, #980, #900, #52, #47, #44, #40, #33, #20, #10, #5, #260, MA7, MA8, MA100, MA230 or MA220; Raven450, Raven450, Raven450. Raven460, Raven760Ultra, Raven860Ultra, Raven1000, Raven1035, Raven760, Raven860, Raven1060, Raven1255 or Raven3500; printex95, printex200, Special black250, Special black100, Mogul E. Black pearls E, Regal 250R, Regal 250, Regal 400R, Regal 400, Monarch 120, Monarch 460, Monarch 490, Monarch 1500, Monarch 700, Monarch 430, Monarch 1100, ELFTEX 320 or ELFTEX 325, and so on. The above names are pigment codes or trade names.

The above examples of pigment are commercially available.

An example of the optically active polymer may be aromatic acid acrylate half ester, whose acid value may be 100 mg KOH/g-350 mg KOH/g. For example, the suitable aromatic acid acrylate half ester can be aromatic acid (meth) acrylate half ester.

Furthermore, optically active polymer may comprise structure units of the following general formula and have an acid value of 20 mg KOH/g-350 mg KOH/g,

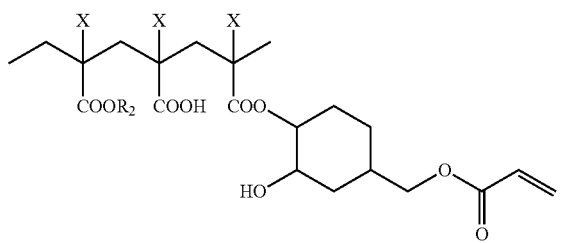

wherein X refers to methyl or hydrogen atom, and $R_2$ refers to alkyl or alkoxy.

Examples of the optically active monomer may comprise aliphatic polyurethane acrylate, polyether acrylate, acrylate, polyester acrylate containing hydroxyl group, maleimide, phthalimide, 2-hydroxy-4-phthalimide, hydroxy-containing acids having 2-6 carbon atoms, hydroxy-containing anhydrides having 2-6 carbon atoms, epoxy resins with multiple methyl benzene epoxy groups in main chain, or any combination thereof.

Examples of the solvent used may comprise: acidic solvents such as formic acid, acetic acid and chloroform; alkaline solvents such as ketones, esters, ethers and aromatic hydrocarbons; and neutral solvents such as aliphatic hydrocarbons, cyclic alkanes and aromatic hydrocarbons. Specifically, the solvent used comprises aliphatic alcohol, glycol ether, ethyl acetate, methyl ethyl ketone, methyl isobutyl ketone, monomethyl ether ethylene glycol ester (ethylene glycol monomethyl ether acetate), γ-butyrolactone, ethyl 3-ethoxypropionate, butyl carbitol, butyl carbitol acetate, propylene glycol monomethyl ether, propylene glycol monomethyl ether acetate, cyclohexanone, xylene, isopropyl alcohol, n-butanol, or any combination comprising at least one of the foregoing solvents. It is preferred that the solvent is propylene glycol monomethyl ether, propylene glycol monomethyl ether acetate, cyclohexane, butyl carbitol, ethyl 3-ethoxypropionate, butyl carbitol acetate, γ-butyrolactone, or any combination thereof.

The photoinitiator is used to initiate free radical polymerization and/or cationic polymerization upon irradiating corresponding components with UV, and can be a free radical photoinitiator, a cationic photoinitiator, or a mixture of a free radical photoinitiator and a cationic photoinitiator. Examples of photoinitiators may comprise: ketone oxime ester photoinitiators such as Ciba OXE 01 and CGI 242; α-amino ketone photoinitiators such as 369, 379 and 907; acetophenone photoinitiators; acyl phosphine oxides; hydrogen abstraction photoinitiators such as aromatic ketone photoinitiators, for example 2-phenylbenzyl-2-dimethylamino-1-(4-morpholino-benzylphenyl)butanone, benzophenone and its derivatives, methyl o-benzoyl benzoate, and thioxanthone; small molecule onium or ferrocenium salts such as aromatic sulfonium salts (for example UVI-6976 and UVI-6992), iodonium salts (for example IRGACURE 250), triphenyl sulfonium salts, diaryl iodonium salts, ferrocenium salts (for example η6-cumene ferrocene oxide complexs and η6-pyrene ferrocene oxide complexs); macromolecular photoinitiators, such as cationic onium salts containing long-chain alkyl, alkoxy, or ester groups, salts containing cationic moieties of polyurethane, salts containing polycyclic aromatic cations, and so on. The above photoinitiators can be used alone or in combination.

Examples of additives may comprise: surfactants, defoamers, light stabilizers, antioxidants, fixing promotors, or any combination thereof. Among these additives, the surface active agent can be silicone surfactants such as BYK-333, BYK-378, TEGO 432, TEGO 435, TEGO 450, BD-3077, CoatOsil 1211 and CoatOsil; polyacrylate surfactants such as BYK-361N; or fluorine surfactants, such as FC-4430, FWT, JF-202 and JF-203.

Example 1

The components of the photosensitive resin composition of Example 1 are listed in Table 1, which comprised: 6% of pigment, 1.8% of dispersant, 1.8% of dispersion resin, 0.5% of reflective particles, 76.45% of solvent, 6% of optically active polymer, 5% of optically active monomer, 1.5% of epoxy resin, 0.8% of photoinitiator, and 0.15% of additives, wherein the above percentages are weight percentage.

Example 2

The components of the photosensitive resin composition of Example 2 are listed in Table 1, which comprised: 6% of pigment, 2.5% of dispersant, 2% of dispersion resin, 1% of reflective particles, 67.4% of solvent, 10% of optically active polymer, 8% of optically active monomer, 2.5% of epoxy resin, 0.45% of photoinitiator, and 0.15% of additives, wherein the above percentages are weight percentage.

Example 3

The components of the photosensitive resin composition of Example 3 are listed in Table 1, which comprised: 8% of pigment, 4% of dispersant, 2.4% of dispersion resin, 1.5% of reflective particles, 60.07% of solvent, 12% of optically active polymer, 8% of optically active monomer, 1.8% of epoxy resin, 2% of photoinitiator, and 0.23% of additives, wherein the above percentages are weight percentage.

Example 4

The components of the photosensitive resin composition of Example 4 are listed in Table 1, which comprised: 8% of pigment, 4% of dispersant, 2.4% of dispersion resin, 2% of reflective particles, 55.65% of solvent, 15% of optically active polymer, 8% of optically active monomer, 2.5% of epoxy resin, 2% of photoinitiator, and 0.45% of additives, wherein the above percentages are weight percentage.

Example 5

The components of the photosensitive resin composition of Example 5 are listed in Table 1, which comprised: 9.5% of pigment, 4.5% of dispersant, 2.7% of dispersion resin, 1.5% of reflective particles, 44% of solvent, 18% of optically active polymer, 12% of optically active monomer, 2.8% of epoxy resin, 2.5% of photoinitiator, and 2.5% of additives, wherein the above percentages are weight percentage.

Example 6

The components of the photosensitive resin composition of Example 6 are listed in Table 1, which comprised: 9.5% of pigment, 5% of dispersant, 2.9% of dispersion resin, 2% of reflective particles, 41.3% of solvent, 18% of optically active polymer, 13% of optically active monomer, 3% of epoxy resin, 2.5% of photoinitiator, and 2.8% of additives, wherein the above percentages are weight percentage.

Example 7

The components of the photosensitive resin composition of Example 7 are listed in Table 1, which comprised: 11% of pigment, 5.5% of dispersant, 3.2% of dispersion resin, 6% of reflective particles, 25.2% of solvent, 25% of optically active polymer, 14.5% of optically active monomer, 3.5% of epoxy resin, 2.8% of photoinitiator, and 3.3% of additives, wherein the above percentages are weight percentage.

Example 8

The components of the photosensitive resin composition of Example 8 are listed in Table 1, which comprised: 11% of pigment, 5.5% of dispersant, 3.3% of dispersion resin, 8% of reflective particles, 16.9% of solvent, 25% of optically active polymer, 20% of optically active monomer, 4.5% of epoxy resin, 2.8% of photoinitiator, and 3% of additives, wherein the above percentages are weight percentage.

Example 9

The components of the photosensitive resin composition of Example 9 are listed in Table 1, which comprised: 4.5% of pigment, 2% of dispersant, 1.65% of dispersion resin, 1% of reflective particles, 81.88% of solvent, 4.5% of optically active polymer, 3% of optically active monomer, 0.45% of epoxy resin, 1% of photoinitiator, and 0.02% of additives, wherein the above percentages are weight percentage.

Example 10

The components of the photosensitive resin composition of Example 10 are listed in Table 1, which comprised: 5% of pigment, 2.75% of dispersant, 1.65% of dispersion resin, 1% of reflective particles, 78.87% of solvent, 4.5% of optically active polymer, 4% of optically active monomer, 1.2% of epoxy resin, 1% of photoinitiator, and 0.03% of additives, wherein the above percentages are weight percentage.

Since reflective particles incorporated into the photosensitive resin composition of the embodiment can effectively reflect UV light and increase the light path of UV absorption inside a film during the UV curing process, utilization of UV light is improved, and in turn the required energy of UV exposure is reduced. Furthermore, due to light reflection of reflective particles, the diffuse light path in the photosensitive resin film made of the photosensitive resin composition according to the embodiment increases, thereby resultant in reduction in the shading ability of the photosensitive resin film, i.e., improving the transmittance of the photosensitive resin film.

TABLE 1

| Component (wt %) | | 1 | 2 | 3 | 4 | Examples 5 | 6 | 7 | 8 | 9 | 10 | Comparative Example 1 | 2 |
|---|---|---|---|---|---|---|---|---|---|---|---|---|---|
| Pigment | | 6 | 6 | 8 | 8 | 9.5 | 9.5 | 11 | 11 | 4.5 | 5 | 4.5 | 5 |
| Dispersant | | 1.8 | 2.5 | 4 | 4 | 4.5 | 5 | 5.5 | 5.5 | 2 | 2.75 | 2.2 | 2.75 |
| Dispersion Resin | | 1.8 | 2 | 2.4 | 2.4 | 2.7 | 2.9 | 3.2 | 3.3 | 1.65 | 1.65 | 1.65 | 1.65 |
| Reflective Particles | | 0.5 | 1 | 1.5 | 2 | 1.5 | 2 | 6 | 8 | 1 | 1 | 0 | 0 |
| Organic Solvent | PMA | 28.45 | 38.2 | 16.07 | 15.65 | 7.5 | 9 | 9.5 | 9.5 | 33.88 | 30.87 | 34.68 | 31.87 |
| | EEP | 48 | 29.2 | 44 | 40 | 36.5 | 32.3 | 15.7 | 7.4 | 48 | 48 | 48 | 48 |
| Optically Active Polymer | SB 401 | 6 | 10 | 12 | 15 | 18 | 18 | 25 | 25 | 4.5 | 4.5 | 4.5 | 4.5 |
| Optical Active Monomer | DPHA | 0 | 0 | 8 | 8 | 12 | 10 | 10 | 0 | 0 | 0 | 0 | 0 |
| | EBE 264 | 5 | 8 | 0 | 0 | 0 | 3 | 4.5 | 20 | 3 | 4 | 3 | 4 |
| Epoxy Resin | DEN 431 | 1.5 | 2.5 | 1.8 | 2.5 | 2.8 | 3 | 3.5 | 4.5 | 0.45 | 1.2 | 0.45 | 1.2 |
| Photoinitiator | Irgacure 379 | 0 | 0 | 2 | 2 | 2.5 | 2.5 | 2.8 | 2.8 | 0 | 0 | 0 | 0 |
| | Irgacure OXE 01 | 0.8 | 0.45 | 0 | 0 | 0 | 0 | 0 | 0 | 1 | 1 | 1 | 1 |
| Additives | | 0.15 | 0.15 | 0.23 | 0.45 | 2.5 | 2.8 | 3.3 | 3 | 0.02 | 0.03 | 0.02 | 0.03 |
| Evaluation Results | Exposure Energy (mJ/cm$^2$) | 200.45 | 220 | 220 | 200 | 260 | 260 | 220 | 240 | 120 | 150 | 160 | 200 |

Another embodiment of the present invention provides the preparation method for the photosensitive resin composition, which comprises the steps of: dispersing the pigment, i.e., homogenously mixing the pigment with the dispersant, the dispersion resin and some solvent, to obtain a pigment dispersion; and mixing the pigment dispersion with other components to obtain the photosensitive resin composition. Reflective particles can be added during the former step of dispersing the pigment or the later step to obtain the photosensitive resin composition. The embodiment of the method is set forth in details through the following examples.

FIG. 1 is a process flow chart of example 1 of the preparation method for a photosensitive resin composition. In this example, reflective particles are added during the later step to obtain the photosensitive resin composition. This method comprises the following steps.

Step 101, mixing pigment, dispersant and dispersion resin with solvent, and grinding to form a pigment dispersion.

Before preparing the photosensitive resin composition, the pigment to be dispersed is preferable fine so as to form a stable pigment dispersion for later use. If dispersion resin is solid, the dispersion resin may be mixed well with an appropriate solvent through for example high-speed stirring to obtain a resin solution for later use. Pigments to be dispersed are also prepared. If pigment derivatives are used, pigments and pigment derivatives need to be pre-weighed and mixed well by for example shaking and stirring.

An example of step 101 is conducted as follows. 1 wt %-10 wt % of the dispersant is fully dissolved in the solvent in an amount of 10%-30% relative to the total weight of the solvent to form a dispersant solution by for example mixing in a high-speed mixer. The linear speed of the mixer is 5 m/s~15 m/s, and the mixing time is 15 min~60 min. 0 wt %~12 wt % of the pigment is added to the above dispersant solution, and mixed in a mixer to allow the pigment fully wet to form a third mixture solution. The mixer speed is 5 m/s~15 m/s, and the mixing time is 15 min~60 min. If no pigment is added, this process can be omitted, in which case the third mixture solution is the same as the dispersant solution. 1.5 wt %-5 wt % of dispersion resin is dissolved in the solvent in an amount of 5-10% relative to the total weight of the solvent to form a resin solution. This resin solution is added to the third mixture solution, and mixed well in a mixer to form a fourth mixture solution. The mixer speed is 5 m/s~15 m/s, and the mixing time is 15 min~60 min. The solvent with an amount of 50%~85% relative to the total weight of the solvent is added to the fourth mixture solution to dilute the fourth mixture solution. The diluted fourth mixture solution is filled into a sand mill and is ground in the sand mill to form a pigment dispersion. The linear speed of the sand mill is 4.5 m/s~12 m/s, and the power is 150 kwh~1000 kwh. In this step, the amount of solvent used ensures the proper viscosity of the pigment dispersion. Too high viscosity of the pigment dispersion makes the temperature of the pigment dispersion during the process of dispersing the pigment increase too fast, resultant in characteristic change of the components of the pigment dispersion. However, too low viscosity of the pigment dispersion results in poor dispersion due to the insufficient shear force during the process of dispersing the pigment.

Step 102 is conducted as follows. The pigment dispersion is mixed with 0.01 wt %-10 wt % of reflective particles, 2 wt %-25 wt % of optically active polymer, 1 wt %-22 wt % of optically active monomer, 0.4 wt %-5 wt % of epoxy resin, 0.1 wt %-3 wt % of photoinitiator, 0.01 wt %-3.5 wt % of additives and solvent to form a photosensitive resin composition. The amount of solvent used in this step is 0%-10% relative to the total weight of the solvent. The manufactured photosensitive resin composition comprises: 0 wt %-12 wt % of the pigment, 1 wt %-10 wt % of the dispersant, 1.5 wt %-5 wt % of the dispersion resin, 0.01 wt %-10 wt % of the reflective particles, 2 wt %-25 wt % the optically active polymer, 1 wt %-22 wt % of the optically active monomer, 0.4 wt %-5 wt % of the epoxy resin, 0.1 wt %-3 wt % of the photoinitiator, 0.01 wt %-3.5 wt % of the additives, and 5 wt %-85 wt % of the solvent. Also, all the weight percents here are based on the total weight of the photosensitive resin composition.

Since reflective particles incorporated into the photosensitive resin composition can effectively reflect UV light and increase the light path of UV light inside the film during the UV curing process, utilization of UV light is improved and the required energy of UV exposure is reduced accordingly. Furthermore, the transmittance of the photosensitive resin film made of the manufactured photosensitive resin composition is also improved.

Figure 2:
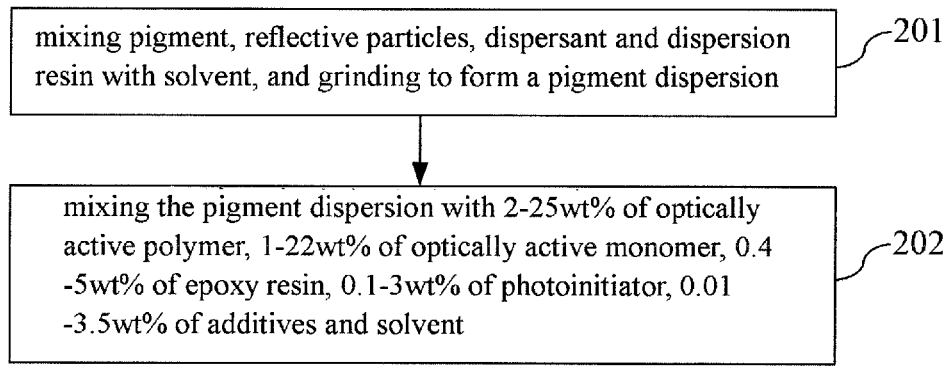
FIG. 2 is a process flow chart of preparation method example 2 of a photosensitive resin composition.

FIG. 2 is a process flow chart of example 2 of the preparation method for the photosensitive resin composition. In this example, reflective particles are added during the step of dispersing the pigment. This method comprises the following steps.

Step 201, mixing pigment, reflective particles, dispersant and dispersion resin with solvent, and grinding to form a pigment dispersion.

An example of step 201 is conducted as follows. 1 wt %-10 wt % of the dispersant is fully dissolved in the solvent in an amount of 10%-30% relative to the total weight of the solvent to form a dispersant solution by for example mixing in a high-speed mixer. The linear speed of the mixer may be 5 m/s~15 m/s, and the mixing time may be 15 min~60 min. 0 wt %~12 wt % of the pigment and 0.01%-10% of reflective particles are added to the above dispersant solution, and mixed in a mixer to allow the pigment and reflective particles fully wet to form a first mixture solution. The mixer speed is 5 m/s~15 m/s, and the mixing time is 15 min~60 min. 1.5 wt %-4 wt % of dispersion resin is dissolved in the solvent in an amount of 5-10% relative to the total weight of the solvent to form a resin solution. This resin solution is added to the first mixture and mixed well in a mixer to form a second mixture solution. The mixer speed is 5 m/s~15 m/s, and the mixing time is 15 min~60 min. The solvent with an amount of 50%~85% relative to the total weight of the solvent is added to the second mixture solution to dilute the second mixture solution. The diluted second mixture solution is filled into a sand mill and is ground in the sand mill to form a pigment dispersion. The linear speed of sand mill is 4.5 m/s~12 m/s, and the power is 150 kwh~1000 kwh. In this step, the amount of solvent used ensures the proper viscosity of the pigment dispersion. Too high viscosity of the pigment dispersion would make the temperature of the pigment dispersion during the process of dispersing the pigment increase too fast, resultant in characteristic change of the components of the pigment dispersion. However, too low viscosity of the pigment dispersion would result in poor dispersion due to the insufficient shear force during the process of dispersing the pigment.

Step 202 is conducted as follows. The pigment dispersion is mixed with 2 wt %-25 wt % of optically active polymer, 1 wt %-22 wt % of optically active monomer, 0.4 wt %-5 wt % of epoxy resin, 0.1 wt %-3 wt % of photoinitiator, 0.01 wt %-3.5 wt % of additives and solvent to form a photosensitive resin composition. The amount of solvent used in this step is 0%-10% relative to the total weight of the solvent. The manufactured photosensitive resin composition comprises: 0 wt %-12 wt % of the pigment, 1 wt %-10 wt % of the dispersant, 1.5 wt %-5 wt % of the dispersion resin, 0.01 wt %-10 wt % of the reflective particles, 2 wt %-25 wt % the optically active polymer, 1 wt %-22 wt % of the optically active monomer, 0.4 wt %-5 wt % of the epoxy resin, 0.1 wt %-3 wt % of the photoinitiator, 0.01 wt %-3.5 wt % of the additives, and 5 wt %-85 wt % of the solvent. Also, all the weight percents here are based on the total weight of the photosensitive resin composition.

Since reflective particles incorporated into the photosensitive resin composition can effectively reflect UV light and increase the light path of UV light inside the film during the UV curing process, utilization of UV light is improved, and thus the required energy of UV exposure is reduced accordingly. Furthermore, the transmittance of the photosensitive resin film made of the above photosensitive resin composition is also improved.

UV energies required for the UV curing of the photosensitive resin composition of the embodiment are examined in the following examples.

First, the method for forming films of the photosensitive resin composition can comprise the following steps:

coating for example a glass substrate with the photosensitive resin composition to form a photosensitive resin film;

subjecting the photosensitive resin film to heat treatment, e.g., baking the photosensitive resin film at a temperature of 50-120° C. for 3-5 min;

exposing the resultant photosensitive resin film under UV light of a certain intensity for 2-15 seconds for UV curing, wherein the various UV energy may be required for the each photosensitive resin composition;

developing the exposed photosensitive resin film with for example an alkaline developer; and after-baking the developed photosensitive resin film for example at a temperature of 200-250° C. for 30-60 min to obtain the final film of the photosensitive resin.

The photosensitive resin compositions of Example 1 to Example 10 shown in Table 1 are subjected to the film-forming process using the above method to obtain the photosensitive resin films, wherein UV exposure energies required for the film-forming process are also listed in Table 1. The UV exposure energy required for the film-forming process can be determined from the film-forming properties of the photosensitive resin film.

Photosensitive resin compositions of Example 1 to Example 10 can be prepared by the method of the preparation method example 1 or preparation method example 2. The same energy of UV exposure is needed for the photosensitive resin compositions obtained through these two methods during the film-forming process. For the photosensitive resin composition with a high level of reflective particles (such as the compositions of Examples 7 and 8), the method of the preparation method example 2 is preferred because of the following reasons: when the level of reflective particles is high, incorporating reflective particles during forming the pigment dispersion allow reflective particles sufficiently uniformly dispersed in the photosensitive resin composition so that the resultant photosensitive resin composition possesses better film-forming performance and is advantageous to form a film having better smoothness.

The relationship between the content of reflective particles in the photosensitive resin composition and the energy required for UV exposure can be obtained by analyzing the data in Table 1.

As shown in Table 1, no reflective particles are comprised in the photosensitive resin compositions of Comparative Examples 1 and 2. A higher content of pigment leads to a stronger absorption of UV by the pigment, and thus a higher energy of UV exposure is required for the corresponding photosensitive resin composition. Nevertheless, because the pigment contents of Comparative Examples 1 and 2 (4.5% and 5%, respectively) are much lower than those of Examples 1 to 8, the energies of UV exposure required for Comparative Examples 1 and 2 are lower than those required for Examples 1 to 8.

Although the pigment contents in the photosensitive resin compositions of Examples 7 and 8 are higher than those of Examples 5 and 6, the energies of UV exposure required for Examples 7 and 8 are lower than those required for Examples 5 and 6 because the contents of reflective particles of Examples 7 and 8 are much higher than those of Examples 5 and 6.

The component difference between Example 9 and Comparative Example 1 lies in that: the photosensitive resin composition of Example 9 comprises reflective particles, whereas the photosensitive resin composition of Comparative Example 1 comprises no reflective particles; and the weight percentages of all the other components except for solvent in Example 9 are the same as those in Comparative Example 1. The energy of UV exposure required for Example 9 is much lower than that required for Comparative Example 1.

The component difference between Example 10 and Comparative Example 2 lies in that: the photosensitive resin composition of Example 10 comprises reflective particles, whereas the photosensitive resin composition of Comparative Example 2 comprises no reflective particles; and the weight percentages of all the other components except for solvent in Example 10 are the same with those in Comparative Example 2. The energy of UV exposure required for Example 10 is much lower than that required for Comparative Example 2.

As can be learned from the above analysis, the light path of UV absorption inside the film is increased due to the diffuse reflection of reflective particles during the UV curing process, and thus consequently utilization of UV light is improved and low UV energy is required for the photosensitive resin composition of the embodiment, i.e., the required energy of UV exposure is reduced.

The embodiments of the invention being thus described, it will be obvious that the same may be varied in many ways. Such variations are not to be regarded as a departure from the spirit and scope of the invention, and all such modifications as would be obvious to those skilled in the art are intended to be comprised within the scope of the following claims.

What is claimed is:

1. A method of preparing a photosensitive resin composition, comprising:

forming a pigment dispersion by mixing and grinding a pigment component, a dispersant component, a dispersion resin component, and solvent; and mixing the pigment dispersion with reflective particles, an optically active polymer component, an optically active monomer component, an epoxy resin component, a photoinitiator component, additives, and solvent to form the photosensitive resin composition;

wherein the photosensitive resin composition, based on the overall photosensitive resin composition, comprises: a positive amount of up to 12 wt % of the pigment component; 1 to 10 wt % of the dispersant component; 1.5 to 5 wt % of the dispersion resin component; 0.01 to 10 wt % of the reflective particles; 2 to 25 wt % of the optically active polymer component; 1 to 22 wt % of the optically active monomer component; 0.4 to 5 wt % of the epoxy resin component; 0.1 to 3 wt % of the photoinitiator component; 0.01 to 3.5 wt % of the additives; and 5 to 85 wt % of total solvent.

2. A method of preparing a photosensitive resin composition, comprising:

forming a pigment dispersion by mixing and grinding a pigment component, reflective particles, a dispersant component, a dispersion resin component, and solvent; and mixing the pigment dispersion with an optically active polymer component, an optically active monomer component, an epoxy resin component, a photoinitiator component, additives, and solvent to form the photosensitive resin composition;

wherein the photosensitive resin composition, based on the overall photosensitive resin composition, comprises: a positive amount of up to 12 wt % of the pigment component; 1 to 10 wt % of the dispersant component; 1.5 to 5 wt % of the dispersion resin component; 0.01 to 10 wt % of the reflective particles; 2 to 25 wt % of the optically active polymer component; 1 to 22 wt % of the optically active monomer component; 0.4 to 5 wt % of the epoxy resin component; 0.1 to 3 wt % of the photoinitiator component; 0.01 to 3.5 wt % of the additives; and 5 to 85 wt % of total solvent.

3. The method according to claim 2, wherein forming the pigment dispersion by mixing and grinding the pigment component, the reflective particles, the dispersant component, the dispersion resin component, and solvent comprises the steps of:

dissolving the dispersant component in solvent to form a dispersant solution, wherein the amount of solvent used in this step represents 10 to 30 wt % of the total solvent present in the overall photosensitive resin composition;

adding the pigment component and the reflective particles to the dispersant solution, and stirring to allow the pigment component and the reflective particles to fully wet and form a first mixture solution;

dissolving the dispersion resin component in solvent to form a resin solution, wherein the amount of solvent used in this step represents 5 to 10 wt % of the total solvent present in the overall photosensitive resin composition;

adding the resin solution to the first mixture solution and stirring well to form a second mixture solution;

diluting the second mixture solution with solvent, wherein the amount of solvent used in the step represents 50 to 85 wt % of the total solvent present in the overall photosensitive resin composition; and filling a sand mill with the diluted second mixture solution and grinding to form the pigment dispersion.

* * * * *